(12) United States Patent
Sakui et al.

(10) Patent No.: US 12,315,544 B2
(45) Date of Patent: May 27, 2025

(54) SEMICONDUCTOR-ELEMENT-INCLUDING MEMORY DEVICE

(71) Applicant: Unisantis Electronics Singapore Pte. Ltd., Singapore (SG)

(72) Inventors: Koji Sakui, Tokyo (JP); Masakazu Kakumu, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 172 days.

(21) Appl. No.: 18/222,116

(22) Filed: Jul. 14, 2023

(65) Prior Publication Data

US 2024/0029775 A1    Jan. 25, 2024

(30) Foreign Application Priority Data

Jul. 20, 2022   (WO) .................. PCT/JP2022/028163

(51) Int. Cl.
*G11C 7/22*      (2006.01)
*G11C 11/403*    (2006.01)
(Continued)

(52) U.S. Cl.
CPC ........ *G11C 11/403* (2013.01); *G11C 11/4096* (2013.01); *G11C 11/4097* (2013.01); *H10B 12/20* (2023.02)

(58) Field of Classification Search
CPC .......................... G11C 11/403; G11C 11/4096; G11C 11/4097
(Continued)

(56) References Cited

U.S. PATENT DOCUMENTS 11,776,620 B2 * 10/2023 Sakui .................... H10B 12/00
                                                        365/189.011
11,917,807 B2 *  2/2024 Sakui .................. H10D 30/711
(Continued)

FOREIGN PATENT DOCUMENTS

JP     H02-188966 A    7/1990
JP     H03-171768 A    7/1991
(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: "Impact of Surrounding Gate Transistor (SGT) for Ultra-High-Density LSI's", IEEE Transaction on Electron Devices, vol. 38, No. 3, pp. 573-578 (Mar. 1991).

(Continued)

*Primary Examiner* — Viet Q Nguyen
(74) *Attorney, Agent, or Firm* — Crowell & Moring LLP

(57) ABSTRACT

A memory device includes pages arranged in a column direction and each constituted by memory cells arranged in a row direction in plan view on a substrate, each memory cell includes a semiconductor body, first and second impurity regions, and first and second gate conductor layers, and in a page read operation, a first refresh operation of increasing by an impact ionization phenomenon, the number of positive holes in the semiconductor body of a memory cell for which page writing has been performed and a second refresh operation of decreasing the number of positive holes in the semiconductor body of a memory cell for which page writing has not been performed are performed and a third refresh operation for a memory cell, in a page, in which the logical "1" data is stored is performed by using latch data in a sense amplifier circuit.

18 Claims, 10 Drawing Sheets

(51) Int. Cl.
  *G11C 11/4096* (2006.01)
  *G11C 11/4097* (2006.01)
  *H10B 12/00* (2023.01)
(58) Field of Classification Search
  USPC .................................................. 365/189.011
  See application file for complete search history.

(56) References Cited

U.S. PATENT DOCUMENTS

| | | | |
|---|---|---|---|
| 2003/0111681 | A1 | 6/2003 | Kawanaka |
| 2008/0137394 | A1 | 6/2008 | Shimano et al. |
| 2022/0406780 | A1* | 12/2022 | Sakui .................. G11C 11/4091 |
| 2022/0406781 | A1* | 12/2022 | Sakui .................. G11C 11/406 |
| 2023/0422472 | A1* | 12/2023 | Sakui .................. H10B 12/20 |
| 2024/0029775 | A1* | 1/2024 | Sakui .................. G11C 11/403 |
| 2024/0081039 | A1* | 3/2024 | Sakui .................. G11C 16/04 |
| 2024/0081040 | A1* | 3/2024 | Sakui .................. H10B 12/00 |
| 2024/0098967 | A1* | 3/2024 | Sakui .................. G11C 11/4096 |
| 2024/0206150 | A1* | 6/2024 | Sakui .................. G11C 11/4096 |
| 2024/0334675 | A1* | 10/2024 | Sakui .................. H10B 12/20 |

FOREIGN PATENT DOCUMENTS

| | | |
|---|---|---|
| JP | 7057032 B1 | 4/2022 |
| JP | 7057037 B1 | 4/2022 |

OTHER PUBLICATIONS

H. Chung, H. Kim, H. Kim, K. Kim, S. Kim, K. W.Song, J. Kim, Y.C. Oh, Y. Hwang, H. Hong, G. Jin, and C. Chung: "Novel 4F2 DRAM Cell with Vertical Pillar Transistor(VPT)," 2011 Proceeding of the European Solid-State Device Research Conference, (2011).
H. S. Philip Wong, S. Raoux, S. Kim, Jiale Liang, J. R. Reifenberg, B. Rajendran, M. Asheghi and K. E. Goodson: "Phase Change Memory," Proceeding of IEEE, vol. 98, No. 12, December, pp. 2201-2227 (2010).
K. Tsunoda, K .Kinoshita, H. Noshiro, Y. Yamazaki, T. Iizuka, Y. Ito, A. Takahashi, A. Okano, Y. Sato, T. Fukano, M. Aoki, and Y. Sugiyama : "Low Power and high Speed Switching of Ti—doped NiO ReRAM under the Unipolar Voltage Source of less than 3V," IEDM (2007), pp. 767-770.
W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, vol. 62, No. 6, pp. 1- 9 (Jun. 2015).
M. G. Ertosun, K. Lim, C. Park, J. Oh, P. Kirsch, and K. C. Saraswat : "Novel Capacitorless Single-Transistor Charge-Trap DRAM (1T CT DRAM) Utilizing Electron," IEEE Electron Device Letter, vol. 31, No. 5, pp. 405-407 (May 2010).
J. Wan, L. Rojer, A. Zaslavsky, and S. Critoloveanu: "A Compact Capacitor-Less High-Speed DRAM Using Field Effect-Controlled Charge Regeneration," Electron Device Letters, vol. 35, No. 2, pp. 179-181 (2012).
T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp. 1510-1522 (2002).
T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32nm Node and Beyond," IEEE IEDM (2006).
J. Y. Song, W. Y. Choi, J. H. Park, J. D. Lee, and B-G. Park: "Design Optimization of Gate-All-Around (GAA) MOSFETs," IEEE Trans. Electron Devices, vol. 5, No. 3, pp. 186-191, May 2006.
N. Loubet, et al.: "Stacked Nanosheet Gate-All-Around Transistor to Enable Scaling Beyond FinFET," 2017 IEEE Symposium on VLSI Technology Digest of Technical Papers, T17-5, T230-T231, Jun. 2017.
H. Jiang, N. Xu, B. Chen, L. Zeng1, Y. He, G. Du, X. Liu and X. Zhang: "Experimental investigation of self heating effect (SHE) in multiple-fin SOI F inFETs," Semicond. Sci. Technol. 29 (2014) 115021 (7pp).
E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697, Apr. 2006.
F. Morishita, H. Noda, I. Hayashi, T. Gyohten, M. Oksmoto, T. Ipposhi, S. Maegawa, K. Dosaka, and K. Arimoto: "Capacitorless Twin-Transistor Random Access Memory (TTRAM) on SOI," IEICE Trans. Electron., vol. E90-c., No. 4 pp. 765-771 (2007).
K.Sakui, N. Harada, "Dynamic Flash Memory with Dual Gate Surrounding Gate Transistor (SGT)," Proc. IEEE IMW, pp. 72-75(2021).
International Search Report and Written Opinion in Application No. PCT/JP2022/028163, dated Sep. 27, 2022.
International Preliminary Report on Patentability (English Translation) in International Application No. PCT/JP2022/028163, dated Jan. 30, 2025 (5 pages).

\* cited by examiner

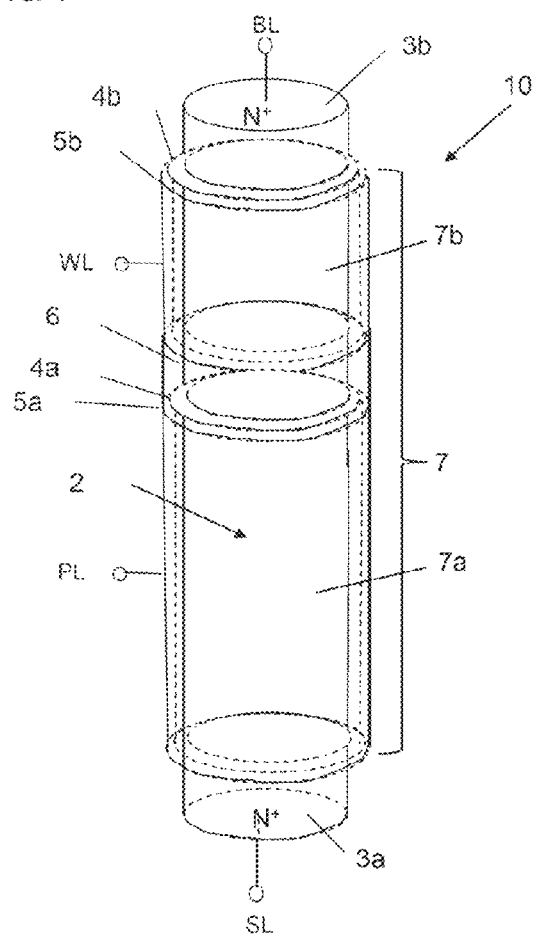

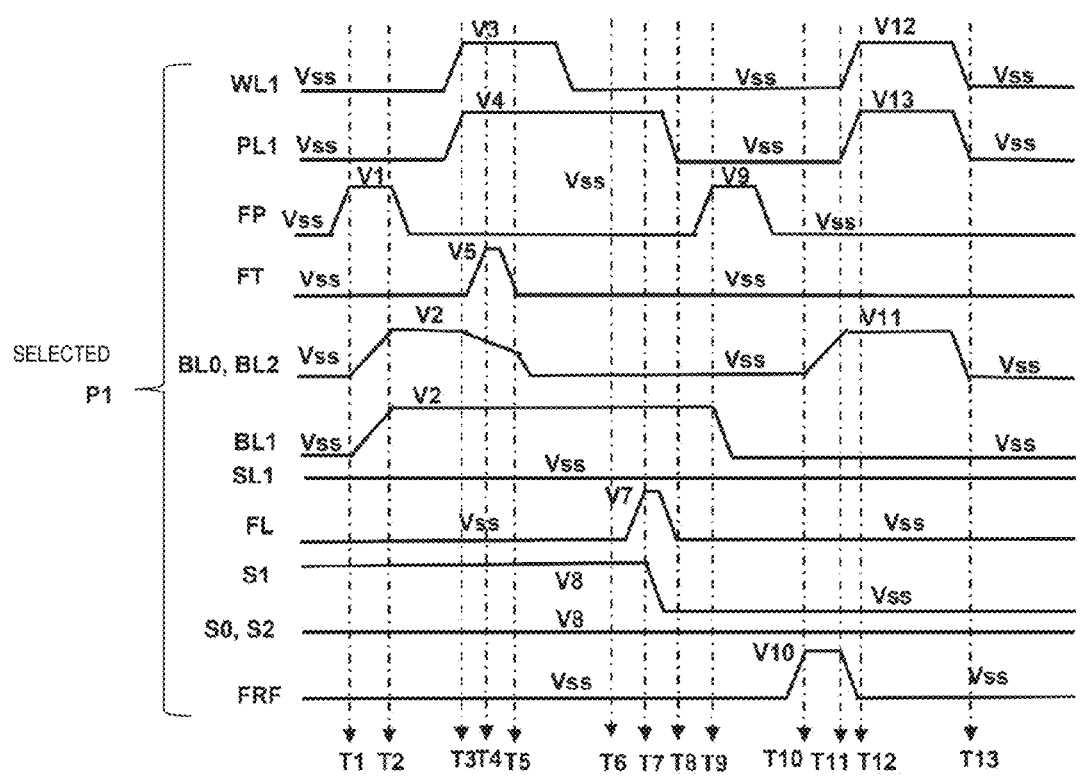

SEMICONDUCTOR-ELEMENT-INCLUDING MEMORY DEVICE

CROSS REFERENCES TO RELATED APPLICATIONS

This application claims priority to PCT/JP2022/028163, filed Jul. 20, 2022, the entire content of which is incorporated herein by reference.

BACKGROUND OF THE INVENTION

1. Field of the Invention

The present invention relates to a semiconductor-element-including memory device.

2. Description of the Related Art

Recently, there has been a demand for highly integrated and high-performance memory elements in the development of LSI (Large Scale Integration) technology.

High-density and high-performance memory elements are being developed. SGTs (Surrounding Gate Transistors, see Japanese Unexamined Patent Application Publication No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)) can be used as selection transistors for, for example, a DRAM (Dynamic Random Access Memory, see, for example, H. Chung, H. Kim, H. Kim, K. Kim, S. Kim, K. W. Song, J. Kim, Y. C. Oh, Y. Hwang, H. Hong, G. Jin, and C. Chung: "4F2 DRAM Cell with Vertical Pillar Transistor (VPT)", 2011 Proceeding of the European Solid-State Device Research Conference, (2011)) to which a capacitor is connected, a PCM (Phase Change Memory, see, for example, H. S. Philip Wong, S. Raoux, S. Kim, Jiale Liang, J. R. Reifenberg, B. Rajendran, M. Asheghi and K. E. Goodson: "Phase Change Memory", Proceeding of IEEE, Vol. 98, No. 12, December, pp. 2201-2227 (2010)) to which a resistance change element is connected, an RRAM (Resistive Random Access Memory, see, for example, K. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3V", IEDM (2007)), and an MRAM (Magneto-resistive Random Access Memory, see, for example, W. Kang, L. Zhang, J. Klein, Y. Zhang, D. Ravelosona, and W. Zhao: "Reconfigurable Codesign of STT-MRAM Under Process Variations in Deeply Scaled Technology", IEEE Transaction on Electron Devices, pp. 1-9 (2015)) that changes the resistance by changing the orientation of a magnetic spin with a current.

There exists, for example, a DRAM memory cell (see Japanese Unexamined Patent Application Publication No. 3-171768, M. G. Ertosun, K. Lim, C. Park, J. Oh, P. Kirsch, and K. C. Saraswat: "Novel Capacitorless Single-Transistor Charge-Trap DRAM (1T CT DRAM) Utilizing Electron", IEEE Electron Device Letter, Vol. 31, No. 5, pp. 405-407 (2010), J. Wan, L. Rojer, A. Zaslavsky, and S. Critoloveanu: "A Compact Capacitor-Less High-Speed DRAM Using Field Effect-Controlled Charge Regeneration", Electron Device Letters, Vol. 35, No. 2, pp. 179-181 (2012), T. Ohsawa, K. Fujita, T. Higashi, Y. Iwata, T. Kajiyama, Y. Asao, and K. Sunouchi: "Memory design using a one-transistor gain cell on SOI", IEEE JSSC, vol. 37, No. 11, pp. 1510-1522 (2002), T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond", IEEE IEDM (2006), and E. Yoshida: "A Capacitorless 1T-DRAM Technology Using Gate-Induced Drain Leakage (GIDL) Current for Low-Power and High-Speed Embedded Memory", IEEE IEDM (2006)) constituted by a single MOS transistor and including no capacitor. For example, among a group of positive holes and electrons generated inside the channel by an impact ionization phenomenon caused by a current between the source and the drain of the N-channel MOS transistor, some or all of the group of positive holes are retained in the channel to write logical storage data "1". The group of positive holes are discharged from inside the channel to write logical storage data "0". With respect to this memory cell, for a common selected word line, a memory cell to which "1" is written and a memory cell to which "0" is written are present at random. When an ON voltage is applied to the selected word line, the floating body channel voltage of a selected memory cell connected to the selected word line changes to a large degree due to capacitive coupling between the gate electrode and the channel. This memory cell has a problem that it experiences a decrease in the operation margin caused by the change in the floating body channel voltage and a decrease in the data retention performance caused by discharge of some of the group of positive holes that are signal charges stored in the channel, which are to be reduced.

There exist twin-transistor MOS transistor memory elements in which a single memory cell is formed in an SOI layer by using two MOS transistors (see, for example, US2008/0137394 A1, US2003/0111681 A1, and F. Morishita, H. Noda, I. Hayashi, T. Gyohten, M. Oksmoto, T. Ipposhi, S. Maegawa, K. Dosaka, and K. Arimoto: "Capacitorless Twin-Transistor Random Access Memory (TTRAM) on SOI", IEICE Trans. Electron., Vol. E90-c., No. 4 pp. 765-771 (2007)). In these elements, an $N^+$ layer that functions as the source or the drain and that separates the floating body channels of the two MOS transistors is formed so as to be in contact with an insulating layer that is on the substrate side. This $N^+$ layer electrically isolates the floating body channels of the two MOS transistors from each other. A group of positive holes that are signal charges are stored only in the floating body channel of one of the MOS transistors. The other MOS transistor functions as a switch for reading the group of positive holes that are signal charges stored in the one of the MOS transistors. Also in this memory cell, the group of positive holes that are signal charges are stored in the channel of the one of the MOS transistors, and therefore, this memory cell has a problem that it experiences a decrease in the operation margin or a decrease in the data retention performance caused by discharge of some of the group of positive holes that are signal charges stored in the channel, which is to be reduced, as in the above-described memory cell constituted by a single MOS transistor.

There exists a dynamic flash memory cell 111 constituted by a MOS transistor and including no capacitor illustrated in FIG. 3A (see Japanese Patent No. 7057032 and K. Sakui, N. Harada, "Dynamic Flash Memory with Dual Gate Surrounding Gate Transistor (SGT)", Proc. IEEE IMW, pp. 72-75 (2021)). As illustrated in FIG. 3A, a floating-body semiconductor body 102 is disposed on a $SiO_2$ layer 101 of an SOI substrate. An $N^+$ layer 103 connected to a source line SL and an N+ layer 104 connected to a bit line BL are disposed at the respective ends of the floating-body semiconductor body 102. A first gate insulator layer 109a is connected to the N+ layer 103 and covers the floating-body semiconductor body 102, and a second gate insulator layer 109b is connected to the N+ layer 104, is connected to the first gate insulator layer 109a with a slit insulating film 110 therebetween, and covers the floating-body semiconductor body 102. A first gate conductor layer 105a covers the first gate insulator layer 109a and is connected to a plate line PL, and a second gate conductor layer 105b covers the second gate insulator layer 109b and is connected to a word line WL. Between the first gate conductor layer 105a and the second gate conductor layer 105b, the slit insulating layer 110 is disposed. These constitute the memory cell 111 of a DFM (dynamic flash memory). The source line SL may be connected to the N+ layer 104 and the bit line BL may be connected to the N+ layer 103.

As illustrated in FIG. 3A, for example, a zero voltage is applied to the N+ layer 103 and a positive voltage is applied to the N+ layer 104 to operate a first N-channel MOS transistor region that is a part of the floating-body semiconductor body 102 covered by the first gate conductor layer 105a in the saturation region and to operate a second N-channel MOS transistor region that is a part of the floating-body semiconductor body 102 covered by the second gate conductor layer 105b in the linear region. As a result, a pinch-off point is not present in the second N-channel MOS transistor region and an inversion layer 107b is formed on the entire surface. The inversion layer 107b that is formed below the second gate conductor layer 105b to which the word line WL is connected substantially functions as the drain of the first N-channel MOS transistor region. As a result, the electric field becomes maximum in a boundary region of the semiconductor body between the first N-channel MOS transistor region and the second N-channel MOS transistor region, and an impact ionization phenomenon occurs in this region. As illustrated in FIG. 3B, among a group of electrons and positive holes generated by the impact ionization phenomenon, the group of electrons are discharged from the floating-body semiconductor body 102 and some or all of a group of positive holes 106 are retained in the floating-body semiconductor body 102 to thereby perform a memory write operation. This state corresponds to logical storage data "1".

As illustrated in FIG. 3C, for example, a positive voltage is applied to the plate line PL, a zero voltage is applied to the word line WL and the bit line BL, and a negative voltage is applied to the source line SL to discharge the group of positive holes 106 from the floating-body semiconductor body 102 and perform an erase operation. This state corresponds to logical storage data "0". When the voltage applied to the first gate conductor layer 105a connected to the plate line PL is set to a voltage higher than a threshold voltage at the time of logical storage data "1" and lower than a threshold voltage at the time of logical storage data "0" in data reading, a property that a current does not flow even when the voltage of the word line WL is increased in reading of logical storage data "0" can be attained as illustrated in FIG. 3D. With this property, the operation margin can be increased to a large degree compared with the above-described memory cells. In the memory cell described here, the channels of the first and second N-channel MOS transistor regions respectively having the first gate conductor layer 105a connected to the plate line PL and the second gate conductor layer 105b connected to the word line WL as their gates are connected in the floating-body semiconductor body 102, which significantly reduces a change in the voltage of the floating-body semiconductor body 102 occurring in response to application of a selection pulse voltage to the word line WL. Accordingly, the decrease in the operation margin or the decrease in the data retention performance caused by discharge of some of the group of positive holes that are signal charges stored in the channel, which is a problem of the above-described memory cells, can be reduced to a large degree. In the future, further improvement of the properties of the memory element will be required.

SUMMARY OF THE INVENTION

For a dynamic flash memory cell, a refresh operation for retaining logical data in the memory cell is required.

To address the above-described problems, a semiconductor-element-including memory device according to the present invention is a memory device in which in plan view on a substrate, a plurality of pages are arranged in a column direction, each of the pages being constituted by a plurality of memory cells arranged in a row direction, each of the memory cells included in each of the pages including:

a semiconductor body that stands on the substrate in a vertical direction or that extends along the substrate in a horizontal direction;

a first impurity region and a second impurity region that are disposed at respective ends of the semiconductor body;

a gate insulator layer that is in contact with a side surface of the semiconductor body between the first impurity region and the second impurity region;

a first gate conductor layer that partially or entirely covers the gate insulator layer; and a second gate conductor layer that is adjacent to the first gate conductor layer and that is in contact with a side surface of the gate insulator layer, in which voltages applied to the first impurity region, the second impurity region, the first gate conductor layer, and the second gate conductor layer are controlled to perform a page erase operation and a page write operation, and in a page read operation, a first refresh operation, a second refresh operation, and a third refresh operation are performed, the first refresh operation being an operation of increasing the number of positive holes in a group of positive holes in the semiconductor body of a memory cell, in a page among the pages, in which logical "1" data is stored, by an impact ionization phenomenon caused by a current flowing from the second impurity region to the memory cell, the second refresh operation being an operation of making some of a group of positive holes in the semiconductor body of a memory cell, in a page among the pages, in which logical "0" data is stored disappear with a bit line pre-charge voltage retained in the second impurity region and by controlling the voltages applied to the first impurity region, the first gate conductor layer, and the second gate conductor layer and decreasing the number of positive holes, the third refresh operation being an operation for the memory cell, in a page among the pages, in which the logical "1" data is stored, by using latch data in a sense amplifier circuit to which the second impurity region is connected with a switch circuit therebetween (first invention).

In the first invention described above, the first impurity region is connected to a source line, the second impurity region is connected to a bit line, one of the first gate conductor layer or the second gate conductor layer is connected to a word line, and the other of the first gate conductor layer or the second gate conductor layer is connected to a plate line, and voltages applied to the source line, the bit line, the word line, and the plate line are controlled to perform the page write operation, the page erase operation, the page read operation, the first refresh operation, the second refresh operation, and the third refresh operation (second invention).

In the second invention described above, the voltages applied to the source line, the bit line, the word line, and the plate line are controlled to perform the page erase operation of making some of a group of positive holes in the semiconductor body of each of the memory cells in a page among the pages disappear and decreasing the number of positive holes, and to perform the page write operation of increasing by an impact ionization phenomenon, the number of positive holes in the semiconductor body of a selected memory cell in a page among the pages (third invention).

In the second invention described above, in the page read operation, the bit line pre-charge voltage is formed of charges that remain in the bit line of the memory cell in which the logical "0" data is stored (fourth invention).

In the first invention described above, in the page erase operation, a voltage of the semiconductor body is made equal to a first data retention voltage, and in the page write operation, the voltage of the semiconductor body is made equal to a second data retention voltage that is higher than the first data retention voltage (fifth invention).

In the second invention described above, the word line and the plate line are disposed in parallel in plan view, and the bit line is disposed in a direction perpendicular to the word line and the plate line in plan view (sixth invention).

In the second invention described above, a first gate capacitance between the semiconductor body and the first gate conductor layer or the second gate conductor layer to which the plate line is connected is larger than a second gate capacitance between the semiconductor body and the first gate conductor layer or the second gate conductor layer to which the word line is connected (seventh invention).

In the second invention described above, in plan view, the source line includes isolated source lines that are disposed for respective groups of memory cells arranged in the column direction and that are disposed parallel to the word line and the plate line (eighth invention).

In the second invention described above, in plan view, the source line is disposed so as to be connected in common to all of the memory cells in pages adjacent to each other (ninth invention).

In the first invention described above, the semiconductor body is a P-type semiconductor layer, and the first impurity region and the second impurity region are N-type semiconductor layers (tenth invention).

In the first invention described above, in the page erase operation, selective erasing is performed for the memory cells in at least two pages (eleventh invention).

In the first invention described above, the first gate conductor layer is constituted by two divided gate conductor layers isolated from each other, and the divided gate conductor layers are positioned on respective sides of the second gate conductor layer, and the page write operation, the page erase operation, the page read operation, the first refresh operation, the second refresh operation, and the third refresh operation are performed (twelfth invention).

In the first invention described above, the second gate conductor layer is constituted by two divided gate conductor layers isolated from each other, and the divided gate conductor layers are positioned on respective sides of the first gate conductor layer, and the page write operation, the page erase operation, the page read operation, the first refresh operation, the second refresh operation, and the third refresh operation are performed (thirteenth invention).

In the second invention described above, the word line and the plate line are connected to a row decoder circuit, the row decoder circuit receives a row address, and a page is selected from among the pages in accordance with the row address (fourteenth invention).

In the first invention described above, the sense amplifier circuit is connected to a column decoder circuit, the column decoder circuit receives a column address, and the sense amplifier circuit is selectively connected to an input/output circuit in accordance with the column address (fifteenth invention).

In the second invention described above, the sense amplifier circuit is a forced-inversion-type sense amplifier circuit, and the forced-inversion-type sense amplifier circuit has a sense node that is inverted when a current in the memory cell does not flow into the bit line (sixteenth invention).

In the second invention described above, the first refresh operation and the second refresh operation are successively performed without a reset operation of changing the voltage applied to the plate line being performed (seventeenth invention).

In the first invention described above, the third refresh operation is not performed each time the page read operation is performed (eighteenth invention).

BRIEF DESCRIPTION OF THE DRAWINGS

FIG. 1 is a structural diagram of an SGT-including memory cell according to a first embodiment;

FIG. 2L is a diagram for explaining the first to third refresh operations of the memory device according to the first embodiment.

DESCRIPTION OF THE PREFERRED EMBODIMENTS

Figure 2A:
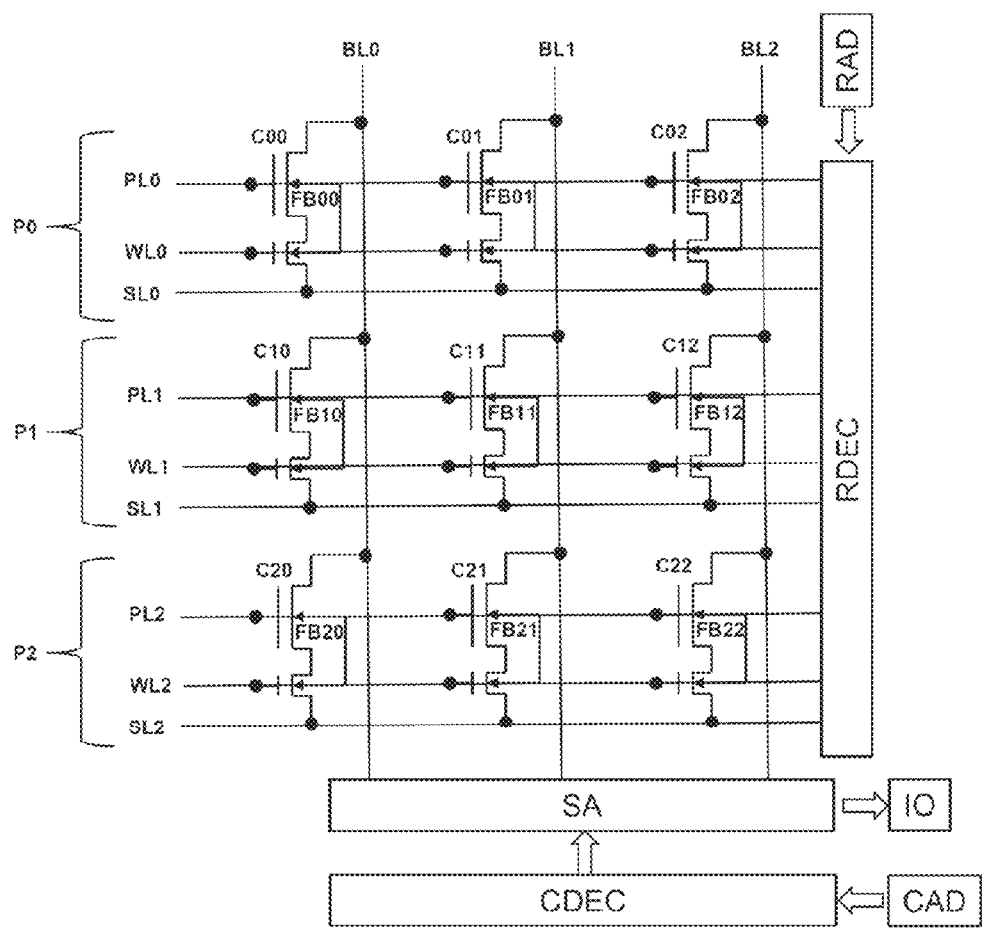
FIG. 2A is a diagram for explaining first to third refresh operations of a memory device according to the first embodiment.

Hereinafter, a semiconductor-element-including memory device (hereinafter called a dynamic flash memory) according to embodiments of the present invention will be described with reference to the drawings.

First Embodiment

The structure and operation mechanisms of a dynamic flash memory cell according to a first embodiment of the present invention will be described with reference to FIG. 1 and FIGS. 2A to 2L. The structure of the dynamic flash memory cell will be described with reference to FIG. 1. A mechanism of a page read operation that allows a refresh operation for logical "1" data and logical "0" data will be described with reference to FIGS. 2A to 2L.

FIG. 1 illustrates the structure of the dynamic flash memory cell according to the first embodiment of the present invention. On the top and the bottom of a silicon semiconductor column 2 (the silicon semiconductor column is hereinafter referred to as "Si column") (which is an example of "semiconductor body" in the claims) of the P or i (intrinsic) conductivity type formed on a substrate, N+ layers 3a and 3b (which are examples of "first impurity region" and "second impurity region" in the claims), one of which functions as the source and the other functions as the drain, are formed respectively. The part of the Si column 2 between the N+ layers 3a and 3b that function as the source and the drain functions as a semiconductor body 7 (which is an example of "semiconductor body" in the claims). Around the semiconductor body 7, a first gate insulator layer 4a (which is an example of "gate insulator layer" in the claims) and a second gate insulator layer 4b (which is an example of "gate insulator layer" in the claims) are formed. The first gate insulator layer 4a and the second gate insulator layer 4b are in contact with or in close vicinity to the N+ layers 3a and 3b that function as the source and the drain respectively. Around the first gate insulator layer 4a and the second gate insulator layer 4b, a first gate conductor layer 5a (which is an example of "first gate conductor layer" in the claims) and a second gate conductor layer 5b (which is an example of "second gate conductor layer" in the claims) are formed respectively. The first gate conductor layer 5a and the second gate conductor layer 5b are isolated from each other by an insulating layer 6. The semiconductor body 7 between the N+ layers 3a and 3b is constituted by a first semiconductor body 7a surrounded by the first gate insulator layer 4a and a second semiconductor body 7b surrounded by the second gate insulator layer 4b. Accordingly, the N+ layers 3a and 3b that function as the source and the drain, the semiconductor body 7, the first gate insulator layer 4a, the second gate insulator layer 4b, the first gate conductor layer 5a, and the second gate conductor layer 5b constitute a dynamic flash memory cell 10. The N+ layer 3a that functions as the source is connected to a source line SL (which is an example of "source line" in the claims), the N+ layer 3b that functions as the drain is connected to a bit line BL (which is an example of "bit line" in the claims), the first gate conductor layer 5a is connected to a plate line PL (which is an example of "plate line" in the claims), and the second gate conductor layer 5b is connected to a word line WL (which is an example of "word line" in the claims). Desirably, the dynamic flash memory cell has a structure in which a first gate capacitance (which is an example of "first gate capacitance" in the claims) of the first gate conductor layer 5a to which the plate line PL is connected is larger than a second gate capacitance (which is an example of "second gate capacitance" in the claims) of the second gate conductor layer 5b to which the word line WL is connected. Note that one of the first gate conductor layer 5a or the second gate conductor layer 5b may be divided into two gate conductor layers. In this case, it is desirable to dispose the divided two gate conductor layers on the respective sides of the first gate conductor layer 5a or the second gate conductor layer 5b that is not divided.

With reference to FIG. 2A to FIG. 2L, mechanisms of a first refresh operation (which is an example of "first refresh operation" in the claims), a second refresh operation (which is an example of "second refresh operation" in the claims), and a third refresh operation (which is an example of "third refresh operation" in the claims) of the dynamic flash memory cell according to the first embodiment of the present invention will be described. Further, a mechanism in which the first refresh operation for logical "1" data (which is an example of "logical "1" data" in the claims) in a selected memory cell and the second refresh operation for logical "0" data (which is an example of "logical "0" data" in the claims) in a selected memory cell are performed and the third refresh operation for logical "1" data is performed by using latch data (which is an example of "latch data" in the claims) in a sense amplifier circuit (which is an example of "sense amplifier circuit" in the claims) during a page read operation (which is an example of "page read operation" in the claims) will be described.

FIG. 2A is a memory block diagram including main circuits for explaining the page read operation. Word lines WL0 to WL2 and plate lines PL0 to PL2 are connected to a row decoder circuit RDEC (which is an example of "row decoder circuit" in the claims), the row decoder circuit receives a row address RAD (which is an example of "row address" in the claims), and selection from pages P0 to P2 is made in accordance with the row address RAD. Bit lines BL0 to BL2 are connected to a sense amplifier circuit SA, the sense amplifier circuit SA is connected to a column decoder circuit CDEC (which is an example of "column decoder circuit" in the claims), the column decoder circuit CDEC receives a column address CAD (which is an example of "column address" in the claims), and the sense amplifier circuit SA (which is an example of "sense amplifier circuit" in the claims) is selectively connected to an input/output circuit IO (which is an example of "input/output circuit" in the claims) in accordance with the column address CAD.

Unlike in FIG. 1, the plate lines PL0 to PL2 are disposed adjacent to the bit lines BL0 to BL2, and the word lines WL0 to WL2 are disposed adjacent to source lines SL0 to SL2 for memory cells that constitute the memory block illustrated in FIG. 2A. Although nine memory cells C00 to C22 in three rows and three columns in plan view are illustrated, the number of memory cells included in the actual memory block is larger than nine. When memory cells are arranged in a matrix, one of the directions of the arrangement is called "row direction" (or "in rows") and the direction perpendicular to the one of the directions is called "column direction" (or "in columns"). The source lines SL0 to SL2, the plate lines PL0 to PL2, and the word lines WL0 to WL2 are disposed in parallel, and the bit lines BL0 to BL2 are disposed in a direction perpendicular to the source lines SL0 to SL2, the plate lines PL0 to PL2, and the word lines WL0 to WL2. For example, it is assumed that the memory cells C10 to C12, in a specific page P1, to which the plate line PL1, the word line WL1, and the source line SL1 are connected are selected in this block and the page read operation is performed.

Figure 2B:
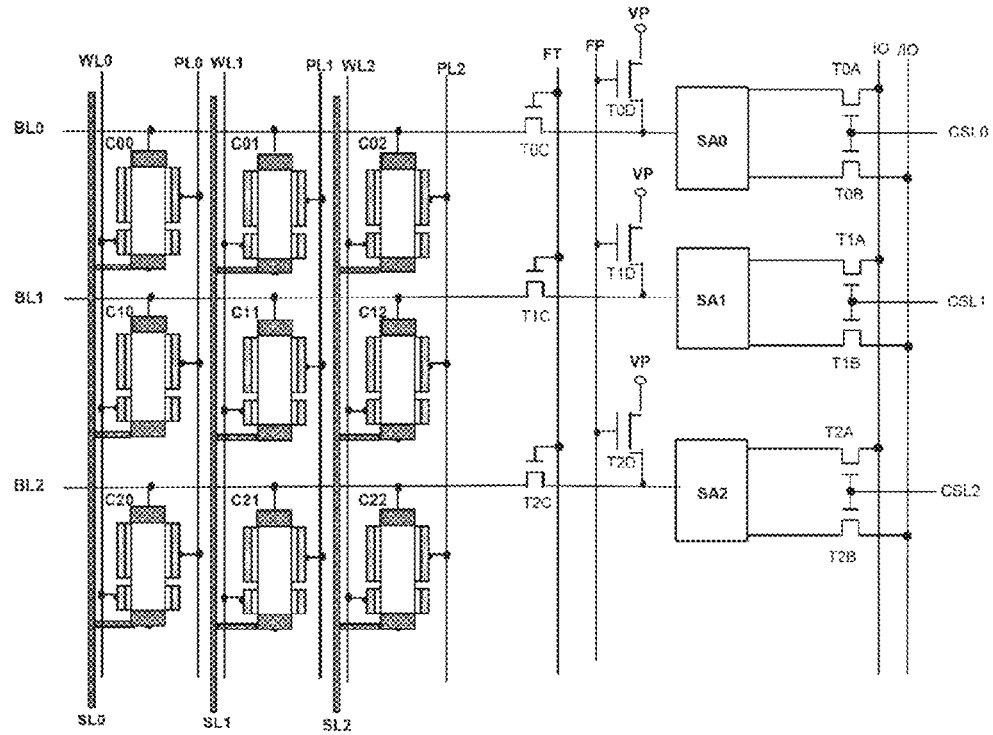
FIG. 2B is a diagram for explaining the first to third refresh operations of the memory device according to the first embodiment.

FIG. 2B illustrates an equivalent circuit of the memory cell block illustrated in FIG. 2A more specifically. Transistors T0C to T2C each having a gate to which a transfer signal FT is input are switch circuits (which are examples of "switch circuit" in the claims). The drains of transistors T0D to T2D each having a gate connected to a bit line supply signal FP are connected to a bit line supply voltage VP, and the sources thereof are connected to the bit lines BL0 to BL2 respectively. The bit lines BL0 to BL2 are respectively connected to sense amplifier circuits SA0 to SA2 with the respective switch circuits therebetween. The sense amplifier circuits SA0 to SA2 are connected to a pair of complementary input/output lines IO and /IO, with transistors T0A to T2B each having a gate connected to a corresponding one of column selection lines CSL0 to CSL2 therebetween.

Figure 2C:
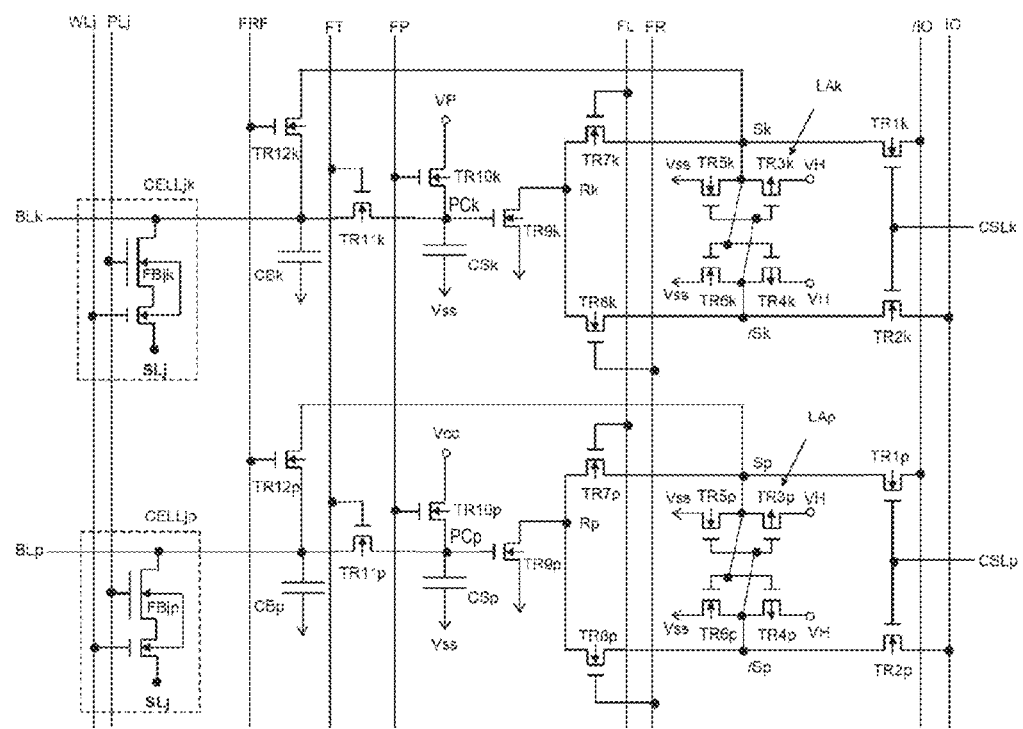
FIG. 2C is a diagram for explaining the first to third refresh operations of the memory device according to the first embodiment.

FIG. 2C is a circuit diagram illustrating a sense amplifier circuit in detail. The sense amplifier circuit illustrated in FIG. 2C is a forced-inversion-type sense amplifier circuit (which is an example of "forced-inversion-type sense amplifier circuit" in the claims). A forced-inversion-type sense amplifier S/Ak is constituted by transistors Tr3k to Tr12k and capacitors CBk and CSk, and a forced-inversion-type sense amplifier S/Ap is constituted by transistors Tr3p to Tr12p and capacitors CBp and CSp. Among these transistors, the transistors TR3k, TR4k, TR3p, and TR4p are P-type MOS transistors, and the transistors TR5k to TR12k and TR5p to TR12p are N-type MOS transistors. Here, a latch-type sense amplifier (flip-flop) LAk is constituted by the transistors TR3k to TR6k, and a latch-type sense amplifier (flip-flop) LAp is constituted by the transistors TR3p to TR6p. The latch-type sense amplifier LAk has complementary sense nodes (which are examples of "sense node" in the claims) Sk and /Sk, and the latch-type sense amplifier LAp has complementary sense nodes Sp and /Sp. To the gates of the transistors TR7k and TR7p, a left sense signal FL is input, and to the gates of the transistors TR8k and TR8p, a right signal line FR is input. The sources of the transistors TR7k and TR8k are connected to an activation node Rk, and the sources of the transistors TR7p and TR8p are connected to a node Rp. To the activation nodes Rk and Rp, the drains of the transistors TR9k and TR9p having respective gates to which charge sharing nodes PCk and PCp are input are connected respectively. The transistors TR10k and TR10p have respective gates to which the bit line supply signal FP is input and have respective sources that are connected to the charge sharing nodes PCk and PCp respectively. To the charge sharing nodes PCk and PCp, stray capacitors CSk and CSp are connected respectively. The transistors TR12k and TR12p have respective gates to which a write signal line FRF is connected and have respective sources to which the bit lines BLk and BLp are connected respectively. To the bit lines BLk and BLp, bit line capacitors CBk and CBp are connected respectively. The bit line capacitors CBk and CBp are far larger than the stray capacitors CSk and CSp and have relationships CBk>CSk and CBp>CSp. Between the bit line BLk and the charge sharing node PCk, the transistor TR11k having a gate connected to a charge sharing signal line FT is connected, and between the bit line BLp and the charge sharing node PCp, the transistor TR11p having a gate connected to the charge sharing signal line FT is connected. The transistors TR11k and TR11p operate as switch circuits.

As illustrated in detail in FIG. 2C, the single-end forced-inversion-type sense amplifiers S/Ak and S/Ap are formed. With the charge sharing nodes PCk and PCp, read data from the bit lines BLk and BLp are fast latched by the latch-type sense amplifiers (flip-flops) LAk and LAp.

Figure 2D:
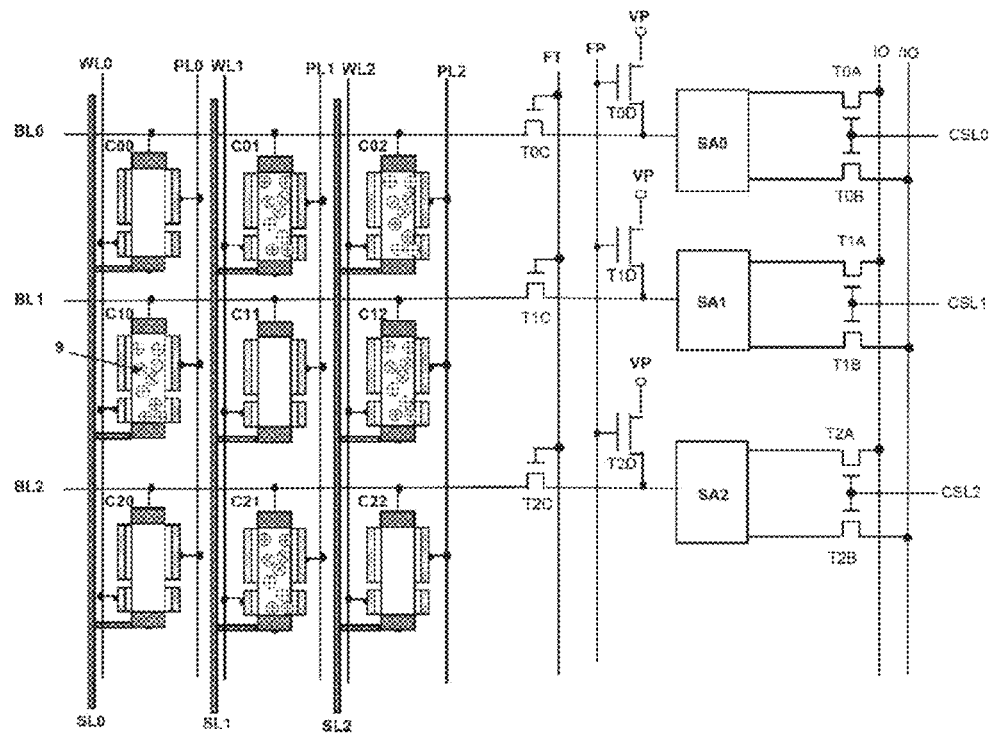
FIG. 2D is a diagram for explaining the first to third refresh operations of the memory device according to the first embodiment.

FIG. 2D illustrates a state in which, at a certain timing, "1" is written to the memory cells C01, C02, C10, C12, and C21 at random among the memory cells C00 to C22, logical "1" data (which is an example of "logical "1" data" in the claims) is stored, and a group of positive holes 9 are stored in the semiconductor body 7 of each of the memory cells and a state in which the group of positive holes 9 are not stored in the semiconductor body 7 of each of the memory cells C00, C11, C20, and C22 to which "1" is not written and logical "0" data (which is an example of "logical "0" data" in the claims) is stored. Here, a state in which the page read operation is performed for a group of memory cells C01, C11, and C21 selected by the word line WL1 will be described.

With reference to the operation waveform diagram illustrated in FIG. 2E, the page read operation will be described. At a first time T1, the bit line supply signal FP rises from a ground voltage Vss to a first voltage V1. Here, the first voltage V1 is equal to, for example, 2.0 V and the bit line supply voltage VP is equal to, for example, 0.6 V, and therefore, the N-type MOS transistors T0D to T2D operate in the linear region. As a result, the bit lines BL0 to BL2 are charged from the ground voltage Vss up to a second voltage V2. Here, the second voltage V2 is a voltage identical to the bit line supply voltage VP and is a bit line pre-charge voltage (which is an example of "bit line pre-charge voltage" in the claims). When the bit line supply signal FP drops from the first voltage V1 to the ground voltage Vss at a second time T2, the bit lines BL0 to BL2 enter a floating state while being kept at the second voltage V2.

At a third time T3, the word line WL1 and the plate line PL1 rise from the ground voltage Vss to a third voltage V3 and a fourth voltage V4 respectively. Here, the third voltage V3 and the fourth voltage V4 are equal to, for example, 1.2 V and 0.9 V respectively. When the threshold voltage of the N-channel MOS transistor region in which the semiconductor body 7 is surrounded by the plate line PL1 of the memory cell C11 in which logical "0" data is stored is, for example, 0.9 V or above, a cell current does not flow through the memory cell C11, discharge of the bit line BL1 does not occur, and the voltage of the bit line BL1 is kept at the second voltage V2, which is the bit line pre-charge voltage. The second voltage V2 is a voltage of the bit line BL1 for reading logical "0" data. In contrast, the threshold voltage of the N-channel MOS transistor region in which the semiconductor body 7 is surrounded by the plate line PL1 of the memory cells C01 and C21 in which logical "1" data is stored is, for example, 0.9 V or below, and a cell current flows through the memory cells C01 and C21. As a result, discharge of the bit lines BL0 and BL2 occurs, and the voltage of the bit lines BL0 and BL2 drops from the second voltage V2, which is the bit line pre-charge voltage, to the ground voltage Vss.

At this time, charges pre-charged in the bit lines BL0 and BL2 are discharged through the memory cells C01 and C21, and therefore, a cell current flows through the memory cells C01 and C21. As a result, as illustrated in FIG. 2F, the first refresh operation (which is an example of "first refresh operation" in the claims), for logical "1" data, of generating the group of positive holes 9 inside the semiconductor body 7 of each of the memory cells C01 and C21 by an impact ionization phenomenon is performed in parallel with the page read operation. As a result, even when the number of positive holes in the group of positive holes 9 stored in the semiconductor body 7 decreases because of the memory cell having being left as is for a long time, the number of positive holes necessary for logical "1" data can be increased, and the data retention property of retaining logical "1" data is improved.

At a fourth time T4, the transfer signal FT rises from the ground voltage Vss to a fifth voltage V5, the transistors T0C to T2C become conducting, and read data of the bit lines BL0 to BL2 are transmitted to the forced-inversion-type sense amplifier circuits SA0 to SA2 respectively. Thereafter, at a fifth time T5, the transfer signal FT drops from the fifth voltage V5 to the ground voltage Vss, and the bit lines BL0 to BL2 are disconnected from the forced-inversion-type sense amplifier circuits SA0 to SA2 respectively. As a result, the load capacitances of the bit lines BL0 and BL2 decrease, and the bit lines BL0 and BL2 rapidly drop to the ground voltage Vss.

Figure 2E:
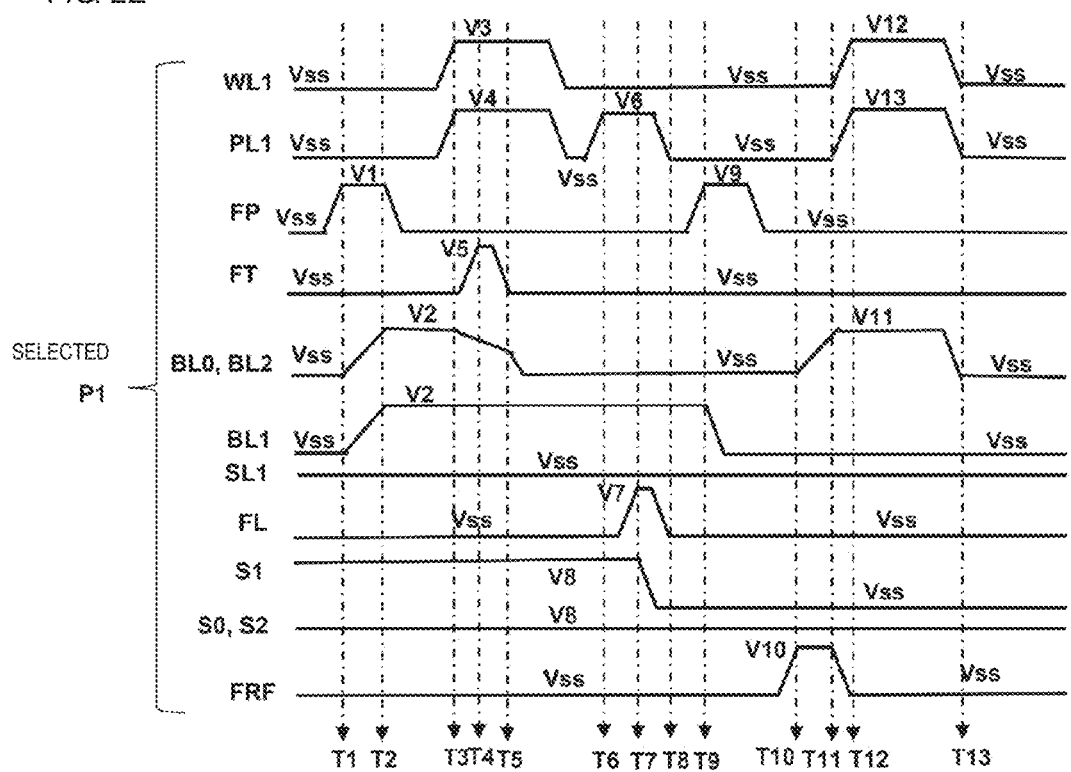
FIG. 2E is a diagram for explaining the first to third refresh operations of the memory device according to the first embodiment.
Figure 2F:
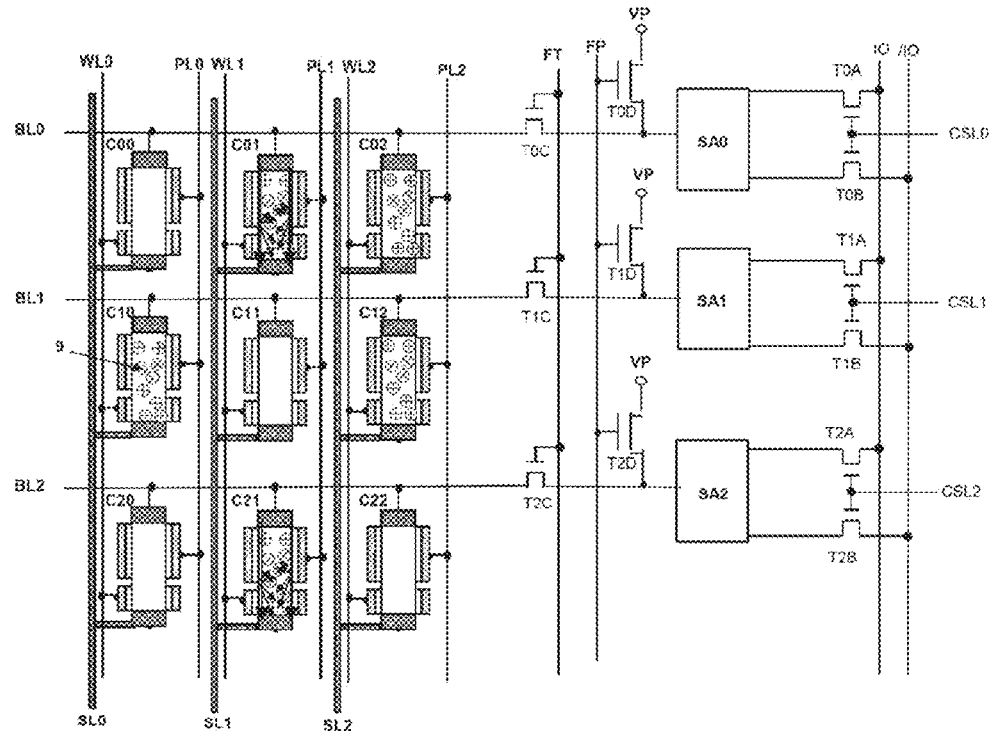
FIG. 2F is a diagram for explaining the first to third refresh operations of the memory device according to the first embodiment.
Figure 2G:
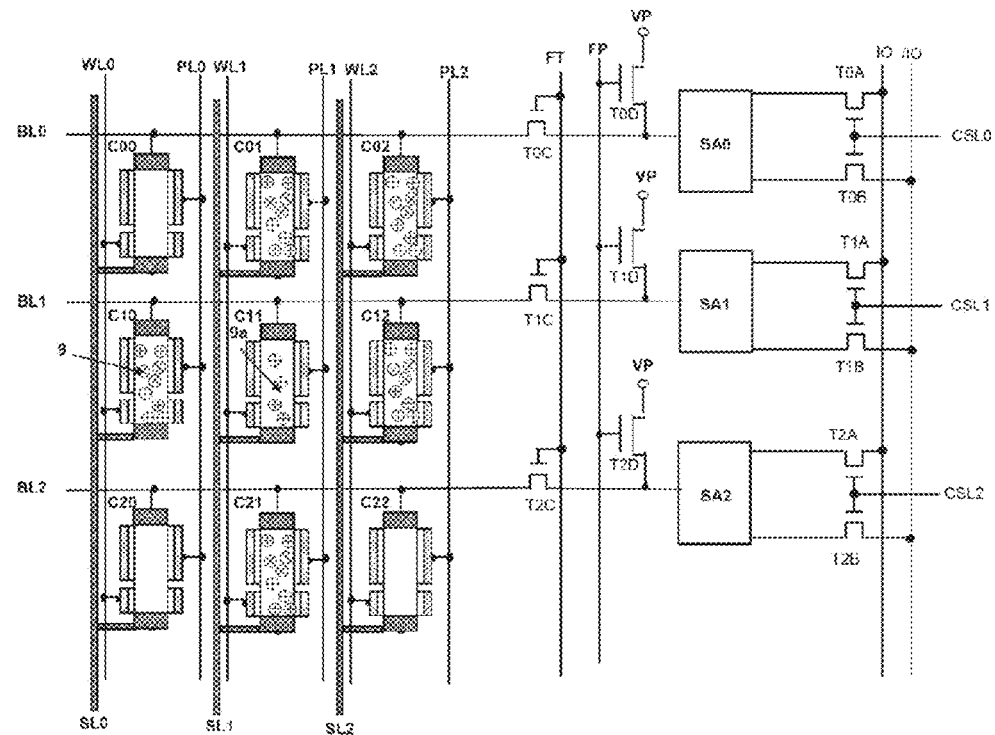
FIG. 2G is a diagram for explaining the first to third refresh operations of the memory device according to the first embodiment.

In contrast, in the memory cell C11 in which logical "0" data is stored, a group of positive holes 9a enter the inside of the semiconductor body 7 of the memory cell C11 during the memory operation or because of the memory cell having being left as is for a long time as illustrated in FIG. 2G.

Figure 2H:
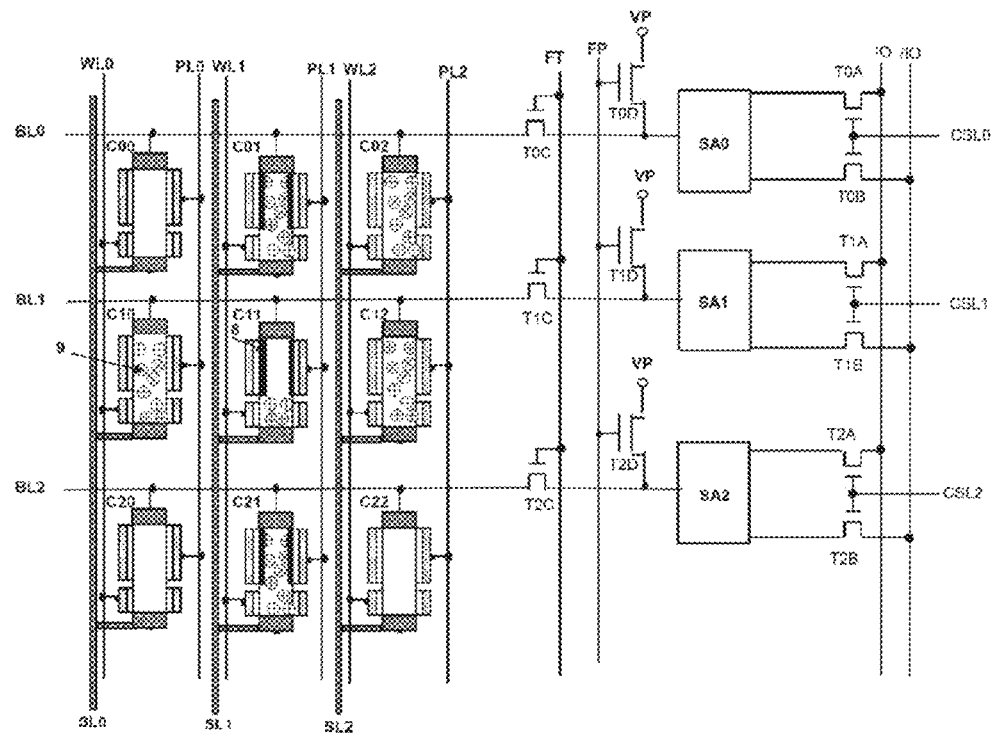
FIG. 2H is a diagram for explaining the first to third refresh operations of the memory device according to the first embodiment.

At a sixth time T6, the plate line PL1 rises from the ground voltage Vss to a sixth voltage V6. At this time, the bit line BL1 is kept at the second voltage V2, which is the bit line pre-charge voltage. Therefore, the second voltage V2, which is the bit line pre-charge voltage, equal to, for example, 0.6 V is applied to the bit line BL1 of the memory cell C11, the ground voltage Vss equal to, for example, 0 V is applied to the source line SL1 thereof, the sixth voltage V6 equal to, for example, 2 V is applied to the plate line PL1 thereof, and the ground voltage equal to, for example, 0 V is applied to the word line WL1 thereof. As a result, as illustrated in FIG. 2H, the group of positive holes 9 having positive charges collect in a part adjacent to the word line WL1 to which 0 V is applied from a part adjacent to the plate line PL1 to which 2 V is applied. Therefore, the voltage of the semiconductor body 7 surrounded by the word line WL1 rises. In the semiconductor body 7 of the memory cell C11 surrounded by the plate line PL1, an inversion layer 8 is formed. Therefore, the PN junction between the N$^+$ layer 3a of the source line SL1 and the P-layer semiconductor body 7 is forward biased, and the entering group of positive holes 9a are discharged to the N$^+$ layer 3a of the source line SL1. The concentration of the group of positive holes 9 collecting in the P-layer semiconductor body 7 in a part adjacent to the word line WL1 is sufficiently higher than the concentration of positive holes facing the N$^+$ layer 3a, and therefore, the concentration gradient causes diffusion of the group of positive holes 9, and the group of positive holes 9 flow into the N$^+$ layer 3a. In contrast, the concentration of electrons in the N$^+$ layer 3a is higher than the concentration of electrons in the P-layer semiconductor body 7, and therefore, with diffusion caused by the concentration gradient, the electrons flow into the P-layer semiconductor body 7. The electrons having flowed into the P-layer semiconductor body 7 recombine with positive holes inside the P-layer semiconductor body 7 and disappear. However, all of the entering electrons do not disappear, and electrons that do not disappear flow into the N$^+$ layer 3b of the bit line BL1 by a drift. Electrons are successively supplied from the source line SL1, and therefore, excessive positive holes recombine with the electrons in a very short time, which results in a return to the initial state. Here, electric power is consumed by the electrons entering from the source line SL1 and the power consumption is very low compared with power consumption during a page write operation. Accordingly, the second refresh operation (which is an example of "second refresh operation" in the claims) for the memory cell C11 in which logical "0" data is stored is performed. As a result, the threshold voltages of the N-channel MOS transistor regions in which the semiconductor body 7 is surrounded by the word line WL1 and the plate line PL1 are increased.

As described above, in the page read operation of the dynamic flash memory cell according to the first embodiment of the present invention, the first refresh operation for logical "1" data and the second refresh operation for logical "0" data can be performed in a state in which the sense amplifier circuits SA0 to SA2 are disconnected from the bit lines BL0 to BL2. Therefore, a significant increase in speed and a decrease in power consumption can be attained compared with existing DRAMs.

At a seventh time T7, the left sense signal FL rises from the ground voltage Vss to a seventh voltage V7. At this time, the bit lines BL0 and BL2 reading logical "1" data are at the ground voltage Vss and the bit line BL1 reading logical "0" data is at the second voltage V2, and therefore, charge sharing nodes PC0 and PC2 are kept at the ground voltage Vss and a charge sharing node PC1 is kept at a high pre-charge voltage (not illustrated). Therefore, a sense node S1 reading logical "0" data drops from an eighth voltage V8 in an initial state to the ground voltage Vss. This is called a forced inversion operation. In contrast, sense nodes S0 and S2 reading logical "1" data are kept at the eighth voltage V8.

At an eighth time T8, the plate line PL1 and the left sense signal FL respectively drop from the sixth voltage V6 and the seventh voltage V7 to the ground voltage Vss. Next, at a ninth time T9, the bit line supply signal FP rises from the ground voltage Vss to a ninth voltage V9. At this time, the bit line supply voltage VP is equal to the ground voltage Vss (not illustrated). Accordingly, the bit line BL1 reading logical "0" data drops from the second voltage V2 to the ground voltage Vss.

At a tenth time T10, a refresh signal FRF rises from the ground voltage Vss to a tenth voltage V10. At this time, the sense nodes S0 and S2 reading logical "1" data are kept at the eighth voltage V8, and therefore, the bit lines BL0 and BL2 rise from the ground voltage Vss to an eleventh voltage V11 at an eleventh time T11.

At a twelfth time T12, the word line WL1 and the plate line PL1 rise from the ground voltage Vss to a twelfth voltage V12 and a thirteenth voltage V13 respectively. As a result, as illustrated in FIG. 2F, the third refresh operation (which is an example of "third refresh operation" in the claims), for logical "1" data, of generating the group of positive holes 9 inside the semiconductor body 7 of each of the memory cells C01 and C21 by an impact ionization phenomenon is performed. This operation is performed for compensating for a slight loss, during the second refresh operation for logical "0" data, of the group of positive holes 9 inside the semiconductor body 7 of each of the memory cells C01 and C21 in which logical "1" data is stored. Therefore, the third refresh operation need not be always performed each time the page read operation is performed. In contrast, the bit line BL1 of the memory cell C11 in which logical "0" data is stored is at the ground voltage Vss, and therefore, a memory cell current does not flow in the memory cell C11, and generation of the group of positive holes 9 by an impact ionization phenomenon does not occur.

Although not illustrated in the operation waveform diagram in FIG. 2E, when the column selection lines CSL0 to CSL2 are input in parallel with the first refresh operation, the second refresh operation, and the third refresh operation, read data of the sense amplifier circuits SA0 to SA2 can be read out of the memory device through the input/output lines IO and /IO.

Figure 2I:
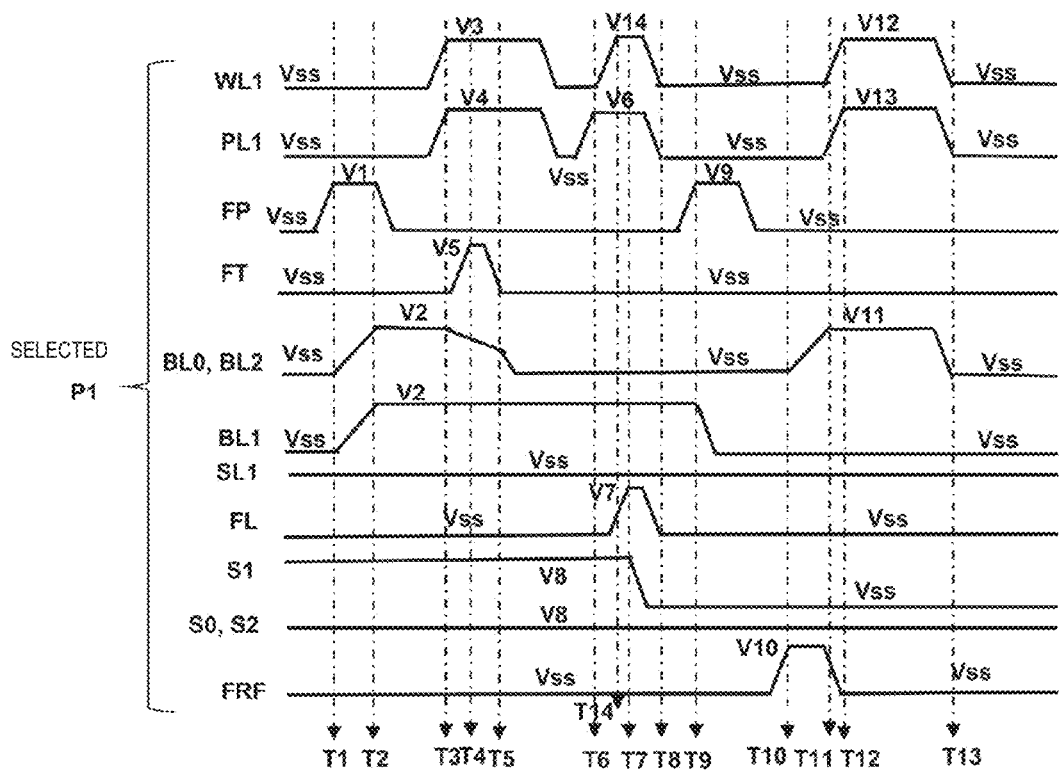
FIG. 2I is a diagram for explaining the first to third refresh operations of the memory device according to the first embodiment.

As illustrated in FIG. 2I, the voltage of the word line WL1 may be increased from the ground voltage Vss to a fourteenth voltage V14 at a fourteenth time T14. This expedites discharge of the group of positive holes 9 from the semiconductor body 7 of the memory cell C11 as explained with reference to FIG. 2H.

Figure 2J:
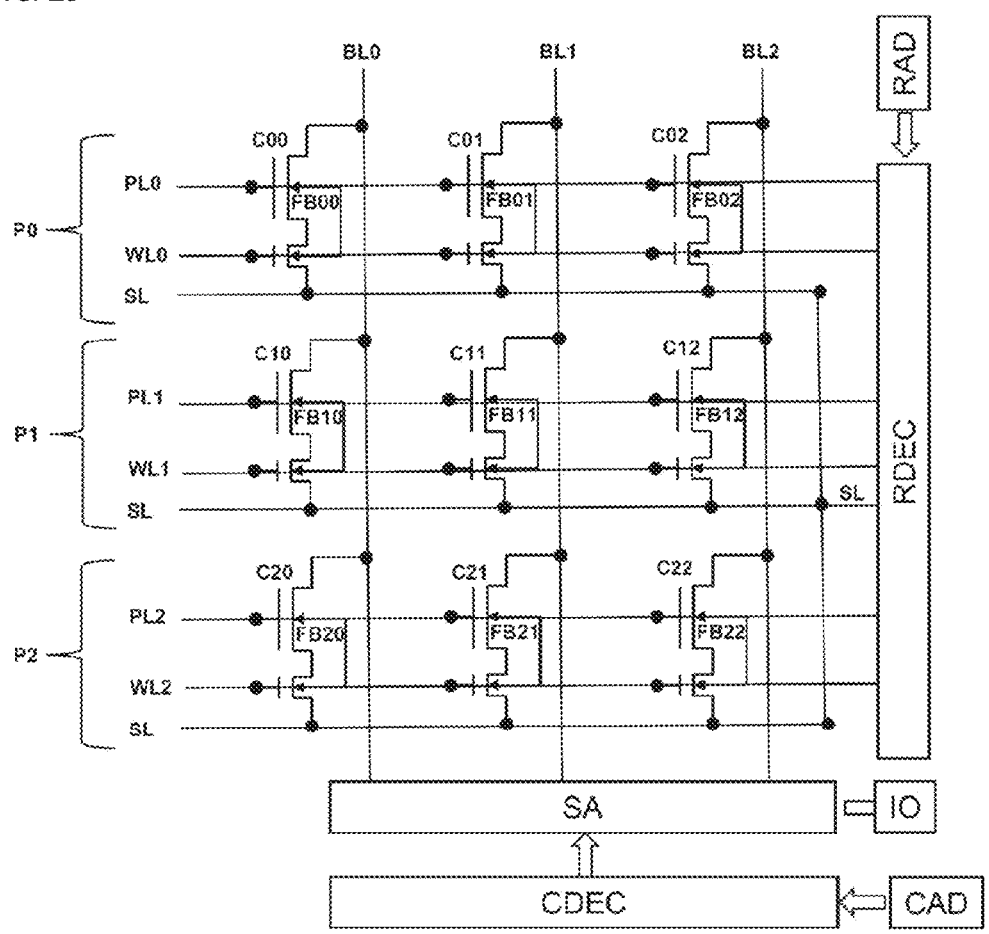
FIG. 2J is a diagram for explaining the first to third refresh operations of the memory device according to the first embodiment.

As illustrated in FIG. 2J, the source line SL may be disposed so as to be connected in common to all of the memory cells in pages adjacent to each other. This makes the design and processes more flexible.

Figure 2K:
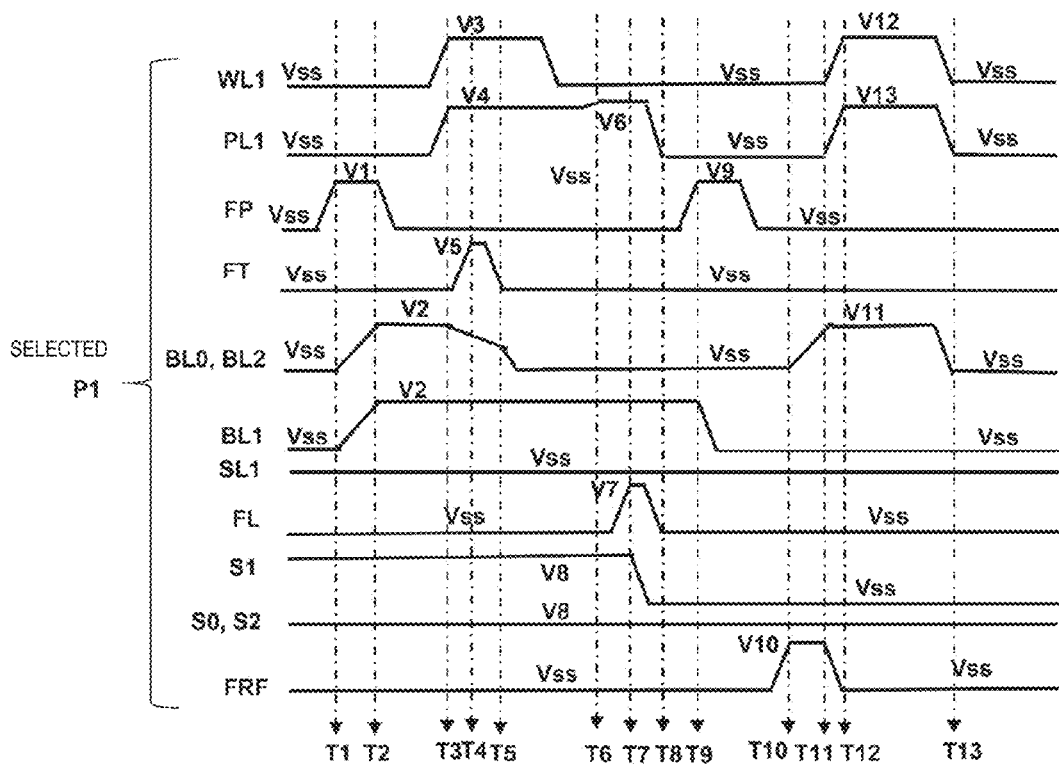
FIG. 2K is a diagram for explaining the first to third refresh operations of the memory device according to the first embodiment.
Figure 3A:
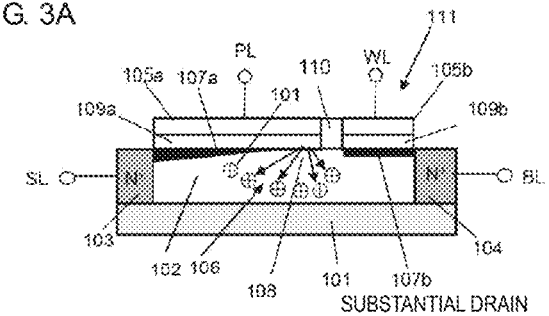
FIGS. 3A, 3B, 3C and 3D are diagrams for explaining a dynamic flash memory in the related art.
Figure 3B:
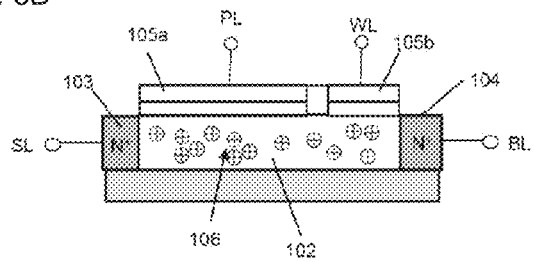
Figure 3C:
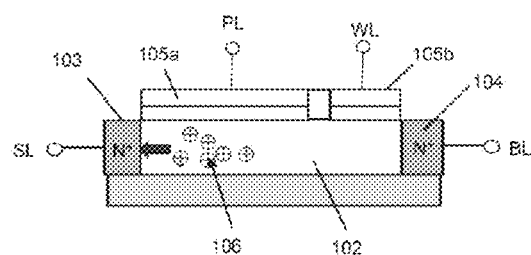
Figure 3D:
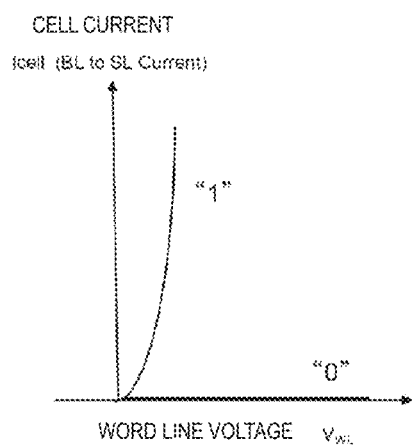

FIG. 2K illustrates an example where the plate line PL1 is not reset to the ground voltage Vss after the end of the sense operation of the bit lines BL0 to BL2 in page reading and is changed from the fourth voltage V4 to the sixth voltage V6 at the sixth time T6. FIG. 2L illustrates an example where the plate line PL1 is not reset to the ground voltage Vss after the end of the sense operation of the bit lines BL0 to BL2 in page reading and is kept at the fourth voltage V4 even after the sixth time T6. In these two examples, a reset operation (which is an example of "reset operation" in the claims) of returning the plate line PL1 to the ground voltage Vss is not performed, which brings an advantage that the first refresh operation and the second refresh operation can be performed in a short time.

Regardless of whether the horizontal cross-sectional shape of the Si column 2 illustrated in FIG. 1 is a round shape, an elliptic shape, or a rectangular shape, the operations of the dynamic flash memory described in this embodiment can be performed. Further, a dynamic flash memory cell having a round shape, a dynamic flash memory cell having an elliptic shape, and a dynamic flash memory cell having a rectangular shape may coexist on the same chip.

With reference to FIG. 1, the dynamic flash memory element including, for example, an SGT in which the first gate insulator layer 4a and the second gate insulator layer 4b that surround the entire side surface of the Si column 2 standing on the substrate in the vertical direction are provided and which includes the first gate conductor layer 5a and the second gate conductor layer 5b that entirely surround the first gate insulator layer 4a and the second gate insulator layer 4b has been described. As indicated in the description of this embodiment, the dynamic flash memory element needs to have a structure that satisfies the condition that the group of positive holes 9 generated by an impact ionization phenomenon are retained in the semiconductor body 7. For this, the semiconductor body 7 needs to have a floating body structure electrically isolated from the substrate. Accordingly, even when the semiconductor body is formed horizontally along the substrate (such that the central axis of the semiconductor body is parallel to the substrate) by using, for example, GAA (Gate All Around, see, for example, J. Y. Song, W. Y. Choi, J. H. Park, J. D. Lee, and B-G. Park: "Design Optimization of Gate-All-Around (GAA) MOSFETs", IEEE Trans. Electron Devices, vol. 5, no. 3, pp. 186-191, (2006)) technology, which is one type of SGT, or nanosheet technology (see, for example, N. Loubet, et al.: "Stacked Nanosheet Gate-All-Around Transistor to Enable Scaling Beyond FinFET", 2017 IEEE Symposium on VLSI Technology Digest of Technical Papers, T17-5, T230-T231, (2017)), the above-described operations of the dynamic flash memory can be performed. The dynamic flash memory element may have a structure in which a plurality of GAA transistors or nanosheets formed in the horizontal direction are stacked. Alternatively, the dynamic flash memory element may have a device structure using SOI (Silicon On Insulator) (see, for example, J. Wan, L. Rojer, A. Zaslavsky, and S. Critoloveanu: "A Compact Capacitor-Less High-Speed DRAM Using Field Effect-Controlled Charge Regeneration", Electron Device Letters, Vol. 35, No. 2, pp. 179-181 (2012), T. Ohsawa, K. Fujita, T. Higashi, Y. Iwata, T. Kajiyama, Y. Asao, and K. Sunouchi: "Memory design using a one-transistor gain cell on SOI", IEEE JSSC, vol. 37, No. 11, pp. 1510-1522 (2002), T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond", IEEE IEDM (2006), and E. Yoshida: "A Capacitorless 1T-DRAM Technology Using Gate-Induced Drain Leakage (GIDL) Current for Low-Power and High-Speed Embedded Memory", IEEE IEDM (2006)). In this device structure, the bottom portion of the semiconductor body is in contact with an insulating layer of the SOI substrate, and the other portion of the semiconductor body is surrounded by a gate insulator layer and an element isolation insulating layer. With such a structure, the semiconductor body also has a floating body structure. Accordingly, the dynamic flash memory element provided in this embodiment needs to satisfy the condition that the semiconductor body has a floating body structure. Even with a structure in which a Fin transistor (see, for example, H. Jiang, N. Xu, B. Chen, L. Zeng1, Y. He, G. Du, X. Liu and X. Zhang: "Experimental investigation of self-heating effect (SHE) in multiple-fin SOI FinFETs", Semicond. Sci. Technol. 29 115021 pp. 7 (2014)) is formed on an SOI substrate, as long as the semiconductor body has a floating body structure, the operations of the dynamic flash memory can be performed.

In FIG. 1, in a direction perpendicular to the substrate, in a part of the semiconductor body 7 surrounded by the insulating layer 6, the potential distribution of the first semiconductor body 7a and that of the second semiconductor body 7b are connected and formed. Accordingly, the first semiconductor body 7a and the second semiconductor body 7b that constitute the semiconductor body 7 are connected in the vertical direction in the region surrounded by the insulating layer 6.

Note that in FIG. 1, it is desirable to make the length of the first gate conductor layer 5a, in the vertical direction, to which the plate line PL is connected longer than the length of the second gate conductor layer 5b, in the vertical direction, to which the word line WL is connected to attain $C_{PL} > C_{WL}$. However, when the plate line PL is only added, the capacitive coupling ratio ($C_{WL}/(C_{PL}+C_{WL}+C_{BL}+C_{SL})$) of the word line WL to the semiconductor body 7 decreases. As a result, the potential change $\Delta V_{FB}$ of the semiconductor body 7 that is a floating body decreases.

Note that in the specification and the claims, the meaning of "cover" in a case of "a gate insulator layer, a gate conductor layer, or the like covers a channel or the like" also includes a case of surrounding entirely as in an SGT or GAA, a case of surrounding except a portion as in a Fin transistor, and a case of overlapping a flat object as in a planar transistor.

Although the first gate conductor layer 5a entirely surrounds the first gate insulator layer 4a in FIG. 1, a structure may be employed in which the first gate conductor layer 5a partially surrounds the first gate insulator layer 4a in plan view. The first gate conductor layer 5a having this structure may be divided into at least two gate conductor layers, and the gate conductor layers may each be operated as an electrode of the plate line PL. Similarly, the second gate conductor layer 5b may be divided into two or more gate conductor layers, and the gate conductor layers may each function as a conductive electrode of the word line and may be operated synchronously or asynchronously. One or both of the first gate conductor layer 5a and the second gate conductor layer 5b may be divided into two or more isolated gate conductor layers in plan view or in the vertical direction, and the isolated gate conductor layers may be operated synchronously or asynchronously. In the vertical direction, the isolated gate conductor layers obtained from one of the first gate conductor layer 5a or the second gate conductor layer 5b may be disposed on the respective sides of the other of the first gate conductor layer 5a or the second gate conductor layer 5b. In this case, the operations of the dynamic flash memory can be performed.

In FIG. 1, the first gate conductor layer 5a may be connected to the word line WL and the second gate conductor layer 5b may be connected to the plate line PL. In this case, the above-described operations of the dynamic flash memory can also be performed. Similarly, regardless of whether the plate lines PL0 to PL2 are disposed adjacent to the bit lines BL0 to BL2 or the word lines WL0 to WL2 are disposed adjacent to the bit lines BL0 to BL2 for the memory cells that constitute the memory block illustrated in FIG. 2A, the above-described operations of the dynamic flash memory can also be performed.

This embodiment has the following feature.

Feature

Features of the dynamic flash memory cell according to the first embodiment of the present invention are the first to third refresh operations performed during the page read operation. In the present invention, in the page read operation, the first refresh operation can be performed in parallel with the page read operation. As a result, for the group of positive holes 9 that are increasingly lost during the memory operation or because of the memory cell having being left as is for a long time, the group of positive holes 9 can be regenerated in the semiconductor body 7 by an impact ionization phenomenon in order to maintain logical "1" data. Further, the second refresh operation can be performed in the page read operation, and the bit line pre-charge voltage retained in the bit line is used to make the group of positive holes 9 having entered the semiconductor body 7 disappear from the semiconductor body 7, on the basis of the storage data in the memory cell, in order to maintain logical "0" data. When the page read operation is performed as described above, the refresh operation (first refresh operation) for logical "1" data and the refresh operation (second refresh operation) for logical "0" data can be performed. A slight loss, during the second refresh operation, of the group of positive holes 9 in the semiconductor body 7 of a memory cell in which logical "1" data is stored can be compensated for by the refresh operation (third refresh operation) for logical "1" data by using latch data in the sense amplifier circuit. The third refresh operation can also be performed in parallel with the page read operation. As a result, the retaining property of retaining storage data in the memory cell can be increased, and a highly reliable memory device can be provided. With these refresh operations, a further increase in speed and a decrease in power consumption can be attained compared with existing DRAMs.

Other Embodiments

Although the Si column is formed in the present invention, a semiconductor column made of a semiconductor material other than Si may be formed. The same applies to other embodiments according to the present invention.

To write "1", electron-positive hole pairs may be generated by using a gate-induced drain leakage (GIDL) current described in E. Yoshida: "A Capacitorless 1T-DRAM Technology Using Gate-Induced Drain Leakage (GIDL) Current for Low-Power and High-Speed Embedded Memory", IEEE IEDM (2006), and the floating body FB may be filled with the generated group of positive holes. The same applies to other embodiments according to the present invention.

Even with a structure in which the polarity of the conductivity type of each of the $N^+$ layers 3a and 3b and the P-layer Si column 2 in FIG. 1 is reversed, the operations of the dynamic flash memory can be performed. In this case, in the Si column 2 that is of N-type, the majority carriers are electrons. Therefore, a group of electrons generated by impact ionization are stored in the semiconductor body 7, and a "1" state is set.

The Si columns of the memory cells may be arranged in two dimensions in a square lattice or in a diagonal lattice to form a memory block. When the Si columns are disposed in a diagonal lattice, the Si columns connected to one word line may be disposed in a zigzag pattern or a serrated pattern in which each segment is constituted by a plurality of Si columns. The same applies to other embodiments.

Various embodiments and modifications can be made to the present invention without departing from the spirit and scope of the present invention in a broad sense. The above-described embodiments are intended to explain examples of the present invention and are not intended to limit the scope of the present invention. Any of the above-described embodiments and modifications can be combined. Further, the above-described embodiments from which some of the configuration requirements are removed as needed are also within the scope of the technical spirit of the present invention.

With the semiconductor-element-including memory device according to the present invention, a high-density and high-performance dynamic flash memory that is an SGT-including memory device can be obtained.

What is claimed is:

1. A semiconductor-element-including memory device that is a memory device in which in plan view on a substrate, a plurality of pages are arranged in a column direction, each of the pages being constituted by a plurality of memory cells arranged in a row direction, each of the memory cells included in each of the pages comprising:
    a semiconductor body that stands on the substrate in a vertical direction or that extends along the substrate in a horizontal direction;

a first impurity region and a second impurity region that are disposed at respective ends of the semiconductor body;

a gate insulator layer that is in contact with a side surface of the semiconductor body between the first impurity region and the second impurity region;

a first gate conductor layer that partially or entirely covers the gate insulator layer; and a second gate conductor layer that is adjacent to the first gate conductor layer and that is in contact with a side surface of the gate insulator layer, wherein voltages applied to the first impurity region, the second impurity region, the first gate conductor layer, and the second gate conductor layer are controlled to perform a page erase operation and a page write operation, and in a page read operation, a first refresh operation, a second refresh operation, and a third refresh operation are performed, the first refresh operation being an operation of increasing the number of positive holes in a group of positive holes in the semiconductor body of a memory cell, in a page among the pages, in which logical "1" data is stored, by an impact ionization phenomenon caused by a current flowing from the second impurity region to the memory cell, the second refresh operation being an operation of making some of a group of positive holes in the semiconductor body of a memory cell, in a page among the pages, in which logical "0" data is stored disappear with a bit line pre-charge voltage retained in the second impurity region and by controlling the voltages applied to the first impurity region, the first gate conductor layer, and the second gate conductor layer and decreasing the number of positive holes, the third refresh operation being an operation for the memory cell, in a page among the pages, in which the logical "1" data is stored, by using latch data in a sense amplifier circuit to which the second impurity region is connected with a switch circuit therebetween.

2. The semiconductor-element-including memory device according to claim 1, wherein the first impurity region is connected to a source line, the second impurity region is connected to a bit line, one of the first gate conductor layer or the second gate conductor layer is connected to a word line, and the other of the first gate conductor layer or the second gate conductor layer is connected to a plate line, and voltages applied to the source line, the bit line, the word line, and the plate line are controlled to perform the page write operation, the page erase operation, the page read operation, the first refresh operation, the second refresh operation, and the third refresh operation.

3. The semiconductor-element-including memory device according to claim 2, wherein the voltages applied to the source line, the bit line, the word line, and the plate line are controlled to perform the page erase operation of making some of a group of positive holes in the semiconductor body of each of the memory cells in a page among the pages disappear and decreasing the number of positive holes, and to perform the page write operation of increasing by an impact ionization phenomenon, the number of positive holes in the semiconductor body of a selected memory cell in a page among the pages.

4. The semiconductor-element-including memory device according to claim 2, wherein in the page read operation, the bit line pre-charge voltage is formed of charges that remain in the bit line of the memory cell in which the logical "0" data is stored.

5. The semiconductor-element-including memory device according to claim 1, wherein in the page erase operation, a voltage of the semiconductor body is made equal to a first data retention voltage, and in the page write operation, the voltage of the semiconductor body is made equal to a second data retention voltage that is higher than the first data retention voltage.

6. The semiconductor-element-including memory device according to claim 2, wherein the word line and the plate line are disposed in parallel in plan view, and the bit line is disposed in a direction perpendicular to the word line and the plate line in plan view.

7. The semiconductor-element-including memory device according to claim 2, wherein a first gate capacitance between the semiconductor body and the first gate conductor layer or the second gate conductor layer to which the plate line is connected is larger than a second gate capacitance between the semiconductor body and the first gate conductor layer or the second gate conductor layer to which the word line is connected.

8. The semiconductor-element-including memory device according to claim 2, wherein in plan view, the source line includes isolated source lines that are disposed for respective groups of memory cells arranged in the column direction and that are disposed parallel to the word line and the plate line.

9. The semiconductor-element-including memory device according to claim 2, wherein in plan view, the source line is disposed so as to be connected in common to all of the memory cells in pages adjacent to each other.

10. The semiconductor-element-including memory device according to claim 1, wherein the semiconductor body is a P-type semiconductor layer, and the first impurity region and the second impurity region are N-type semiconductor layers.

11. The semiconductor-element-including memory device according to claim 1, wherein in the page erase operation, selective erasing is performed for the memory cells in at least two pages.

12. The semiconductor-element-including memory device according to claim 1, wherein the first gate conductor layer is constituted by two divided gate conductor layers isolated from each other, and the divided gate conductor layers are positioned on respective sides of the second gate conductor layer, and the page write operation, the page erase operation, the page read operation, the first refresh operation, the second refresh operation, and the third refresh operation are performed.

13. The semiconductor-element-including memory device according to claim 1, wherein the second gate conductor layer is constituted by two divided gate conductor layers isolated from each other, and the divided gate conductor layers are positioned on respective sides of the first gate conductor layer, and the page write operation, the page erase operation, the page read operation, the first refresh operation, the second refresh operation, and the third refresh operation are performed.

14. The semiconductor-element-including memory device according to claim 2, wherein
the word line and the plate line are connected to a row decoder circuit, the row decoder circuit receives a row address, and a page is selected from among the pages in accordance with the row address.

15. The semiconductor-element-including memory device according to claim 1, wherein
the sense amplifier circuit is connected to a column decoder circuit, the column decoder circuit receives a column address, and the sense amplifier circuit is selectively connected to an input/output circuit in accordance with the column address.

16. The semiconductor-element-including memory device according to claim 2, wherein
the sense amplifier circuit is a forced-inversion-type sense amplifier circuit, and the forced-inversion-type sense amplifier circuit has a sense node that is inverted when a current in the memory cell does not flow into the bit line.

17. The semiconductor-element-including memory device according to claim 2, wherein
the first refresh operation and the second refresh operation are successively performed without a reset operation of changing the voltage applied to the plate line being performed.

18. The semiconductor-element-including memory device according to claim 1, wherein
the third refresh operation is not performed each time the page read operation is performed.

* * * * *